US010567111B2

(12) United States Patent
Kilian et al.

(10) Patent No.: US 10,567,111 B2
(45) Date of Patent: Feb. 18, 2020

(54) WIRELESS TRANSMISSION METHOD FOR SIMPLE RECEIVERS

(71) Applicant: Fraunhofer-Gesellschaft zur Foerderung der angewandten Forschung e.V., Munich (DE)

(72) Inventors: Gerd Kilian, Erlangen (DE); Jakob Kneissl, Fuerth (DE); Johannes Wechsler, Spalt (DE); Josef Bernhard, Nabburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/881,235

(22) Filed: Jan. 26, 2018

(65) Prior Publication Data

US 2018/0152264 A1    May 31, 2018

Related U.S. Application Data

(63) Continuation of application No. PCT/EP2016/068176, filed on Jul. 29, 2016.

(30) Foreign Application Priority Data

Jul. 30, 2015   (EP) .................... 15179182

(51) Int. Cl.
*H04L 1/00* (2006.01)
*H03M 13/45* (2006.01)
(Continued)

(52) U.S. Cl.
CPC ....... *H04L 1/0011* (2013.01); *H03M 13/3723* (2013.01); *H03M 13/45* (2013.01);
(Continued)

(58) Field of Classification Search
CPC ... H04L 1/0011; H04L 1/0045; H04L 25/067; H04L 1/20; H03M 13/6337; H03M 13/45; H03M 13/3723
See application file for complete search history.

(56) References Cited

U.S. PATENT DOCUMENTS 5,621,764 A    4/1997  Ushirokawa et al.
2005/0201475 A1  9/2005  Alcouffe
(Continued)

FOREIGN PATENT DOCUMENTS

DE    102011082098 A1    3/2013
DE    102011082100 A1    3/2013
(Continued)

OTHER PUBLICATIONS

ETSI EN 302 307 v1.2.1 (Aug. 2009).*
(Continued)

*Primary Examiner* — Jae Y Lee
(74) *Attorney, Agent, or Firm* — Perkins Coie LLP; Michael A. Glenn

(57) ABSTRACT

Embodiments provide a method for transmitting, according to which the payload data included in the data packet is provided with at least one indicator, such that a degree of interference of the received data (e.g. already decided bits) provided by the receiver for receiving data packets (e.g. a simple cost-effective radio chip) can be determined based on the at least one indicator, such that the determined degree of interference can be considered during channel decoding of the channel-coded payload data for increasing efficiency of channel decoding.

22 Claims, 7 Drawing Sheets

(51) Int. Cl.
  *H03M 13/37* (2006.01)
  *H04L 25/06* (2006.01)
  *H03M 13/00* (2006.01)
  *H04L 1/20* (2006.01)

(52) U.S. Cl.
  CPC ...... *H03M 13/6337* (2013.01); *H04L 1/0045* (2013.01); *H04L 25/067* (2013.01); *H04L 1/20* (2013.01)

(56) References Cited

U.S. PATENT DOCUMENTS

| | | |
|---|---|---|
| 2007/0071075 A1 | 3/2007 | Yang et al. |
| 2010/0182903 A1 | 7/2010 | Palanki et al. |
| 2012/0189072 A1 | 7/2012 | Tzannes et al. |
| 2013/0230060 A1* | 9/2013 | Bernhard ................ H04L 7/041 370/474 |
| 2014/0051435 A1* | 2/2014 | Murgan ............ H04W 52/0216 455/434 |
| 2014/0176341 A1 | 6/2014 | Bernhard et al. |
| 2014/0192789 A1 | 7/2014 | Bernhard et al. |
| 2014/0369450 A1* | 12/2014 | Leyh .................... H04B 1/1027 375/346 |
| 2014/0375505 A1* | 12/2014 | Anderson ............. G01S 5/0215 342/464 |
| 2016/0373221 A1* | 12/2016 | Michael ................ H04L 5/0044 |

FOREIGN PATENT DOCUMENTS

| | | |
|---|---|---|
| JP | 1995226688 A | 8/1995 |
| JP | 2007159067 A | 6/2007 |
| JP | 2013236386 A | 11/2013 |
| KR | 20070035239 A | 3/2007 |
| WO | 9750198 A1 | 12/1997 |

OTHER PUBLICATIONS

Pursley, Michael B. et al., "Chapter 8—Reed-Solomon Codes in Frequency-Hop Communications", Reed-Solomon Codes and Their Applications, IEEE Press, USA, Jan. 1, 1999, pp. 150-174.

Pursley, Michael B., Tradeoffs Between Side Information and Code Rate in Slow-Frequency-Hop Packet Radio Networks, IEEE International Conference on Communications '87: Communications—Sound to Light, Jan. 1, 1987, pp. 947-952.

Sunagawa, Yuichiro , et al., "Investigation on Japan ISDB-T 1SEG Software Defined Radio Signal Processing on PC Platform", IEICE Technical Report, The Institute of Electronics Information and Communication Engineers, vol. 110/No. 440, Feb. 24, 2011, 347-352.

\* cited by examiner

WIRELESS TRANSMISSION METHOD FOR SIMPLE RECEIVERS

CROSS-REFERENCE TO RELATED APPLICATIONS

This application is a continuation of copending International Application No. PCT/EP2016/068176, filed Jul. 29, 2016, which is incorporated herein by reference in its entirety, and additionally claims priority from European Application No. EP 15179182.9, filed Jul. 30, 2015, which is also incorporated herein by reference in its entirety.

Embodiments of the present invention relate to a data receiver for receiving payload data and in particular to a data receiver performing weighting-dependent channel decoding of channel-coded payload data that are provided by a simple receiver chip. Further embodiments relate to a method for receiving payload data. Some embodiments relate to a wireless transmission method for simple receivers.

BACKGROUND OF THE INVENTION

Different unidirectional and bidirectional systems for transmitting data between base stations and nodes are known, such as DECT (DECT=Digital Enhanced Cordless Telecommunications) and RFID (RFID=Radio-Frequency Identification). It is typical for these systems that the base station specifies a reference frequency and a reference time with which the participants synchronize. In RFID systems, for example, the reader specifies a time window following immediately after its emission, within which the RFID transponders arbitrary select a time for the response. The specified time interval is additionally divided into timeslots of equal length. This is called a slotted aloha protocol. In DECT, however, time slots are provided within a fixed grid. Here, the base station allocates an exact timeslot to a participant that he may use for communication. Due to the inaccuracy by the quartz tolerance, a buffer time is provided between the timeslots so that the telegrams do not overlap.

DE 10 2011 082 098 B4 describes a battery-operated stationary transmitter arrangement and a method for transmitting a sensor data packet where the sensor data packet is divided into several data packets that are smaller than the actual information that is to be transmitted (telegram splitting). Here, telegrams are divided into several partial packets. Such a partial packet is referred to as hop. In one hop, several information symbols are transmitted. The hops are transmitted on one frequency or distributed across several frequencies (frequency hopping). In between the hops are breaks where no transmission takes place.

Since not only the transmission of data but also the reception of the same entails comparatively high energy consumption, the same system can also be used for the reverse case where data are transmitted from the base station to the node. In this scenario, the energy consumption of the nodes is also to be kept low since the nodes possibly have no constant current supply but practice energy harvesting where the nodes draw energy from the environment (e.g. temperature differences, sunlight, electromagnetic waves etc.) or, as in DE 10 2011 082 098 B4 for transmitting, a battery is available accordingly for receiving which cannot provide the current for the receiver over a sufficiently long time period.

Apart from energy consumption, costs are also a significant criterion when designing a receiving node. Due to that, mostly very simple radio chips (receiver or transceiver) that have low acquisition costs and can operate in an energy-efficient manner can be found on these nodes. However, due to their simple structure, these radio chips lack the ability of determining detailed information on the quality of the channel or the received data. Also, such radio chips offer no option of providing the information necessitated for calculation to another chip. Additionally, the exact channel analysis in an external controller would also cause significant energy consumption. Normally, these cost-effective receiver chips provide an already demodulated digital bit sequence at their output (=decided bits).

SUMMARY

According to an embodiment, a data receiver for receiving payload data transmitted by a data transmitter by means of at least one data packet via a communication channel may have: means for receiving data packets that is configured to receive the at least one data packet, wherein the at least one data packet includes channel-coded payload data and at least one indicator, wherein the means for receiving data packets is configured to output, for the at least one received data packet, received data that include the received channel-coded payload data and the at least one received indicator; means for further processing received data that is configured to determine, from the received data, the received channel-coded payload data and the at least one received indicator and to compare the at least one received indicator of the at least one received data packet to at least one reference indicator that is known to the data transmitter and data receiver and to determine, based on the comparison between the at least one received indicator and the at least one reference indicator, at least one degree of interference of the received channel-coded payload data of the at least one received data packet; wherein the means for further processing received data is configured to weight the received channel-coded payload data of the at least one received data packet based on the determined at least one degree of interference for decoding and to perform channel decoding depending on the weighting of the received channel-coded payload data for obtaining the payload data.

According to another embodiment, a system may have: an inventive data receiver; and a data transmitter that is configured to transmit the data packet with the channel-coded payload data and the at least one indicator to the data receiver via the communication channel.

According to another embodiment, a data transmitter for transmitting payload data by means of at least one data packet via a communication channel to a data receiver may have: means for channel-coding payload data that is configured to channel-code the payload data to obtain channel-coded payload data; means for generating data packets that is configured to generate at least one data packet from the channel-coded payload data, wherein the means for generating data packets is configured to provide the channel-coded payload data with at least one indicator that is known to the data transmitter and the data receiver; and means for transmitting data packets that is configured to transmit the at least one data packet via the communication channel to the data receiver.

According to another embodiment, a method for receiving payload data that are transmitted by a data transmitter by means of at least one data packet via a communication channel may have the steps of: receiving the at least one data packet, wherein the at least one data packet includes channel-coded payload data and the at least one indicator; providing received data for the at least one received data packet, wherein the received data include the received channel-coded payload data and the at least one received indicator; determining the received channel-coded payload data and the at least one received indicator from the received data; comparing the at least one received indicator of the at least one received data packet to at least one reference indicator that is known to the data transmitter and data receiver to determine, based on the comparison between the at least one received indicator and the at least one reference indicator, at least one degree of interference of the received channel-coded payload data of the at least one received data packet; weighting the received channel-coded payload data of the at least one received data packet for decoding based on the determined at least one degree of interference; and performing channel decoding depending on the weighting of the received channel-coded payload data for obtaining the payload data.

Another embodiment may have a non-transitory digital storage medium having a computer program stored thereon to perform the method for receiving payload data that are transmitted by a data transmitter by means of at least one data packet via a communication channel, the method having the steps of: receiving the at least one data packet, wherein the at least one data packet includes channel-coded payload data and the at least one indicator; providing received data for the at least one received data packet, wherein the received data include the received channel-coded payload data and the at least one received indicator; determining the received channel-coded payload data and the at least one received indicator from the received data; comparing the at least one received indicator of the at least one received data packet to at least one reference indicator that is known to the data transmitter and data receiver to determine, based on the comparison between the at least one received indicator and the at least one reference indicator, at least one degree of interference of the received channel-coded payload data of the at least one received data packet; weighting the received channel-coded payload data of the at least one received data packet for decoding based on the determined at least one degree of interference; and performing channel decoding depending on the weighting of the received channel-coded payload data for obtaining the payload data, when said computer program is run by a computer.

Embodiments of the present invention provide data receiver for receiving payload data transmitted by a data transmitter by means of at least one data packet via a communication channel. The data receiver includes means for receiving data packets that is configured to receive the at least one data packet, wherein the at least one data packet comprises channel-coded payload data and at least one indicator, wherein the means for receiving data packets is configured to output, for the at least one received data packet, received data that include the received channel-coded payload data and the at least one received indicator. Further, the data receiver includes means for further processing received data that is configured to determine, from the received data, the received channel-coded payload data and the at least one received indicator and to compare the at least one received indicator of the at least one received data packet to at least one reference indicator that is known to the data transmitter and data receiver and to determine, based on the comparison between the at least one received indicator and the at least one reference indicator, at least one degree of interference of the received channel-coded payload data of the at least one received data packet. Here, the means for further processing received data is configured to weight the received channel-coded payload data of the at least one received data packet based on the determined at least one degree of interference for decoding and to perform channel decoding depending on the weighting of the received channel-coded payload data for obtaining the payload data.

The present invention is based on the idea of additionally providing the payload data included in the data packet with at least one indicator, such that a degree of interference of the received data (e.g. already decided bits) provided by the means for receiving data packets (e.g. a simple cost-effective radio chip) can be determined based on the at least one indicator, such that the determined degree of interference can be considered during channel decoding of the channel-coded payload data for increasing efficiency of channel decoding.

Further embodiments provide a system comprising a data receiver and a data transmitter. The data receiver includes means for receiving data packets that is configured to receive the at least one data packet, wherein the at least one data packet comprises channel-coded payload data and at least one indicator, wherein the means for receiving data packets is configured to output, for the at least one received data packet, received data that include the received channel-coded payload data and the at least one received indicator. Further, the data receiver includes means for further processing received data that is configured to determine, from the received data, the received channel-coded payload data and the at least one received indicator and to compare the at least one received indicator of the at least one received data packet to at least one reference indicator that is known to the data transmitter and data receiver and to determine, based on the comparison between the at least one received indicator and the at least one reference indicator, at least one degree of interference of the received channel-coded payload data of the at least one received data packet. Here, the means for further processing received data is configured to weight the received channel-coded payload data of the at least one received data packet based on the determined at least one degree of interference for decoding and to perform channel decoding depending on the weighting of the received channel-coded payload data for obtaining the payload data. The data transmitter is configured to transmit the data packet with the channel-coded payload data and the at least one indicator to the data receiver via the communication channel.

Further embodiments provide a method for receiving payload data that are transmitted by a data transmitter by means of at least one data packet via a communication channel. The method includes:

receiving the at least one data packet, wherein the at least one data packet comprises channel-coded payload data and at least one indicator;

providing received data for the at least one received data packet, wherein the received data include the received channel-coded payload data and the at least one received indicator;

determining the received channel-coded payload data and the at least one received indicator from the received data;

comparing the at least one received indicator of the at least one received data packet to at least one reference indicator that is known to the data transmitter and data receiver to determine, based on the comparison between the at least one received indicator and the at least one reference indicator, at least one degree of interference of the received channel-coded payload data of the at least one received data packet;

weighting the received channel-coded payload data of the at least one received data packet for decoding based on the determined at least one degree of interference; and performing channel decoding depending on the weighting of the received channel-coded payload data for obtaining the payload data.

BRIEF DESCRIPTION OF THE DRAWINGS

Embodiments of the present invention will be detailed subsequently referring to the appended drawings, in which.

DETAILED DESCRIPTION OF THE INVENTION

In the following description of the embodiments of the invention, the same or equal elements in the figures are provided with the same reference numbers, such that their description is inter-exchangeable in the different embodiments.

Figure 1:
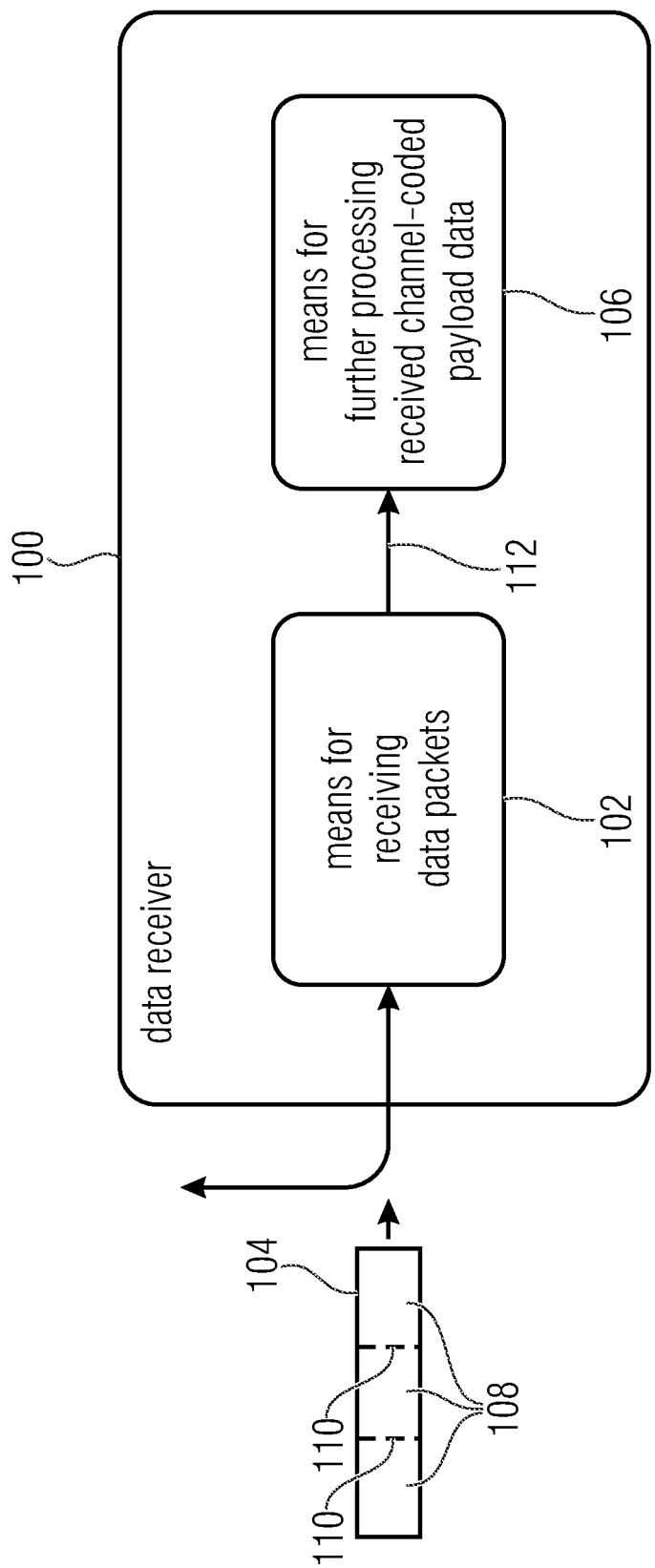
FIG. 1 is a schematic block diagram of a data receiver according to an embodiment of the present invention.

FIG. 1 shows a schematic block diagram of a data receiver 100 according to an embodiment of the present invention. The data receiver 100 includes means 102 for receiving data packets 104 and means 106 for further processing of received data.

The means 102 for receiving data packets 104 is configured to receive the at least one data packet 104, wherein the at least one data packet 104 comprises channel-coded payload data 108 and at least one indicator 110, wherein the means 102 for receiving data packets 104 is configured to output, for the at least one received data packet 104, received data 112 that include the received channel-coded payload data 108 and the at least one received indicator 110.

In embodiments, the means 102 for receiving data packets 104 can be configured to output the received data 112 in the form of already decided bits. Further, the means 102 for receiving data packets 104 can be configured such (e.g. be structured in such a simple manner) that the same cannot output any information on a quality of the received data 112 on a symbol level. Thus, no quality estimation on symbol level (data symbol level) is possible based on the data/ information provided by the means 102 for receiving data packets 104. Further, the means for receiving data packets 104 can be configured such (e.g. be structured in such a simple manner) that the same cannot distinguish between the received channel-coded payload data 108 and the at least one received indicator 110.

The means 102 for receiving data packets 104 can, for example, be a simple or cost-effective receiver chip (or transceiver chip) that provides the received data 112 in the form of already decided bits or an already demodulated digital bit sequence (=decided bits) at its output. Due to the simple structure, the receiver chip lacks the ability of determining information on a quality of a channel or the received data 112. Also, the receiver chip offers no option of providing information that would be necessitated for calculating the quality of the channel or the received data 112 to another chip.

The means 106 for further processing received data 112 is configured to determine, from the received data 112, the received channel-coded payload data 108 and the at least one received indicator 110, and to compare the at least one received indicator 110 of the at least one received data packet 104 to at least one reference indicator that is known to the data transmitter and data receiver 100 and to determine, based on the comparison between the at least one received indicator 110 and the least one reference indicator at least one degree of interference of the received channel-coded payload data 108 of the at least one received data packet 104.

Here, the means 106 for further processing received data 112 is configured to weight the received channel-coded payload data 108 of the at least one received data packet 104 based on the determined at least one degree of interference for decoding and to perform channel decoding depending on the weighting of the received channel-coded payload data 108 to obtain the payload data.

Thus, in embodiments, the means 106 for further processing received data 112 can determine, even before channel decoding of the received channel-coded payload data, a degree of interference of the received channel-coded payload data 108 based on the at least one received indicator 110 and can consider the determined degree of interference when channel decoding the received channel-coded payload data. Due to the fact that the degree of interference of the received channel-coded payload data is considered when channel decoding the received channel-coded payload data, a decoding quality (channel decoding) can be improved.

Figure 2:
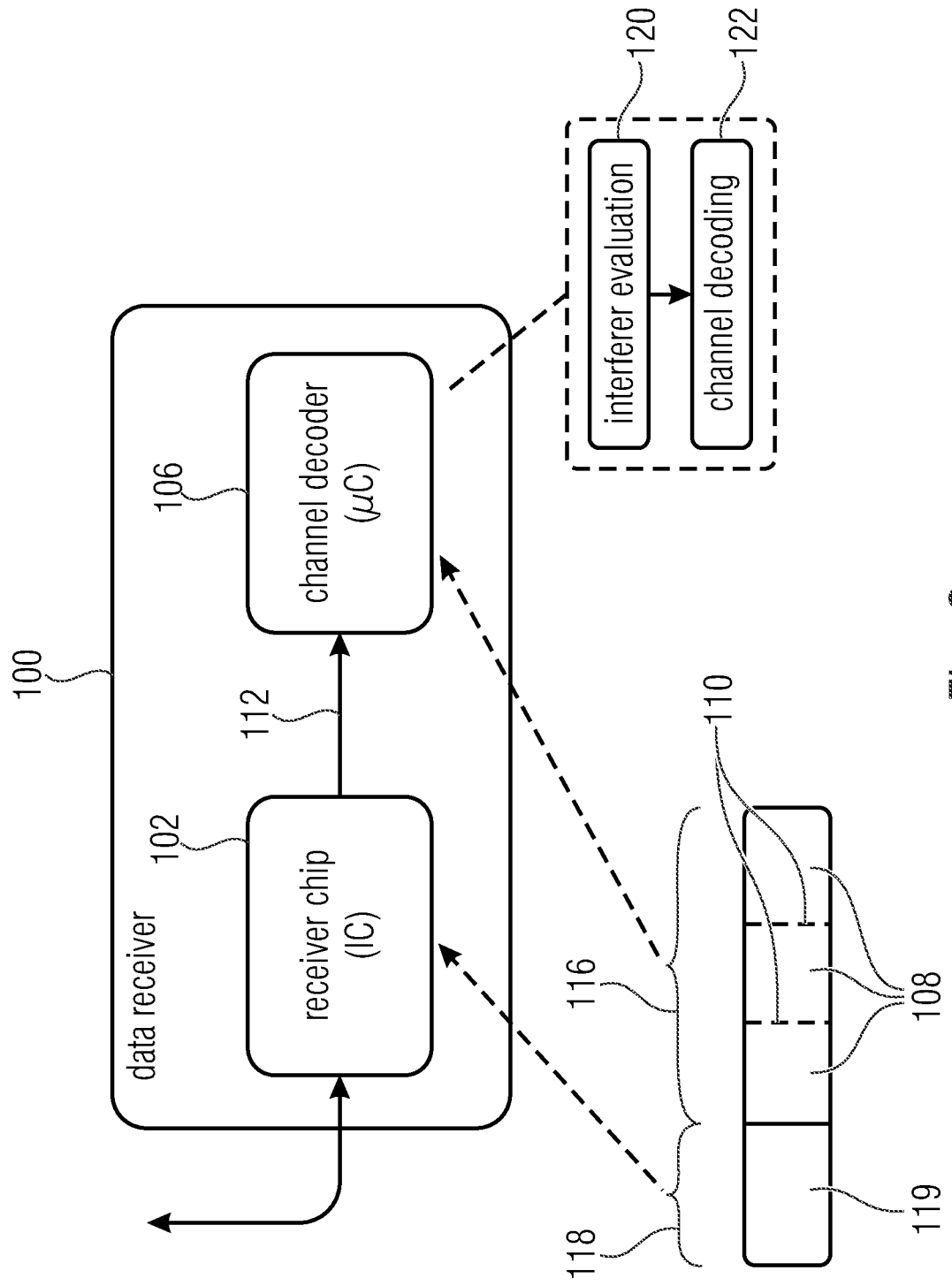
FIG. 2 is a schematic block diagram of a data receiver according to a further embodiment of the present invention.

FIG. 2 shows a schematic block diagram of a data receiver 100 according to a further embodiment of the present invention. The data receiver 100 includes means 102 for receiving data packets 104 and means 106 for further processing received data 112.

As already mentioned above and as shown in FIG. 2, the means 102 for receiving data packets 104 can be a (simple, cost-effective) receiver chip (e.g. an IC (IC=integrated circuit)), while the means 106 for further processing received data 112 can be a decoder or channel decoder (e.g. a μC (μC=microcontroller)).

As further shown in FIG. 2, the data packet 104 can comprise a payload data region 116 and optionally a control data region 118. The control data region is not necessarily at the beginning of the data packet 104 but can be placed at any position.

The control data region 118 can, for example, include a synchronization sequence (or preamble), wherein the means 102 for receiving data packets 104 can be configured to perform synchronization (or frequency estimation) of the data packet 104 by using the synchronization sequence 119. Obviously, the means 102 for receiving data packets 104 can also be configured to receive a data packet 104 without control data region 118, i.e. without synchronization sequence 119. For example, the time of arrival of the data packet 104 can be known to the data receiver 100, whereby the data receiver 100 is able to determine the data packet 104 from a receive data stream at the known time.

Further, the control data region 118 can include a preamble. Here, the means 102 for receiving data packets 104 is configured such that the same does not output the data included in the control data region 118.

The payload data region 116 can include the payload data 108 and the at least one indicator 110 as data. Here, the means 102 for receiving data packets 104 can be configured to output the data included in the payload data region 116 as received data 112 (in the form of already decided bits and as demodulated bit sequence, respectively).

Thus, the at least one indicator 110 included in the data packet 104 is output by the means 102 for receiving data packets 104 only together with the payload data 108 as received data 112 and not used for receiving the data packet 104, e.g. for performing synchronization (of the data packet 104) based on the at least one indicator 110 or by using the at least one indicator 110. As long as the data packet 104 includes the optional control data region 118 with a synchronization sequence 119, the means 102 for receiving data packets 104 can use the control data region 118 for receiving the data packet 104, for example for a synchronization of the data packet 104 by using the synchronization sequence 119 included in the control data region 118. The means 102 for receiving data packets, however, does not output the synchronization sequence 119 (or any other information included in the control data region), such that the means 106 for further processing received data 112 obtains no information from the means 102 for receiving data packets on the quality of the received data 112.

Rather, the means 106 for further processing received data 112 determines, as already described above, prior to decoding the received channel-coded payload data 108, a degree of interference of the received channel-coded payload data 108 based on the at least one received indicator 110 and uses the determined degree of interference when decoding the received channel-coded payload data. The means 106 for further processing received data 112 can, for example, be configured to perform interference evaluation 120 and channel decoding 122 based on the at least one received indicator 110.

Due to the fact that the degree of interference of the received channel-coded payload data is considered when decoding the received channel-coded payload data, decoding quality (channel decoding) can be improved, as will be explained below.

For error protection codes it is very advantageous when it is known whether and how strongly received symbols are corrupted (note: see also enclosed paper, so far unpublished). Deleting the corrupted information in the symbols can be (much) better than using the same. In communication engineering, there is the description in LogLikelihoodRatios which indicates the security of information.

Error protection codes, such as convolution codes, Reed-Solomon codes or also turbo codes can restore receive packets with a large amount of missing or wrong symbols when it is known what symbols are corrupted or faulty, compared to the case of corrupted symbols where it is not known that interference or corruption existed.

For determining how secure the received information is, indicators 110 can be added to the data packet 104 in embodiments. Here, an indicator 100 can consist of a single or several indicator symbols. The indicators and their distribution in a data packet (or hop) 104 are known to the transmitter and receiver prior to communication.

An individual indicator symbol can correspond to a symbol of the used modulation method. The data receiver 100 can compare the received symbols of the indicators 110 to the expected pattern and can determine, based on the difference, the quality of the received data packets (hops) and partial data packet (part of the hop). For these quality assessments, the selection of the indicator symbols and their distribution are of (significant) importance.

The optimum distribution of indicators 110 is mainly based on the length of the expected interferers, the used algorithm for security determination as well as the necessitated receive security. When structuring the indicators 110, it is advantageous to select different modulation symbols as indicator symbols, since it is otherwise not possible to detect interferers in several dimensions due to the simple receive chip 102 returning only decided demodulated symbols.

A simple illustration of this is a binary amplitude modulation. If only high levels are used as indicator symbols, the same are received correctly with a constant loud interferer and the indicators 110 are declared as being error-free, whereby the reliability of the received symbols is assumed to be high, although the low levels appearing in the information symbols are received in the same corrupted manner as high levels.

Figure 3:
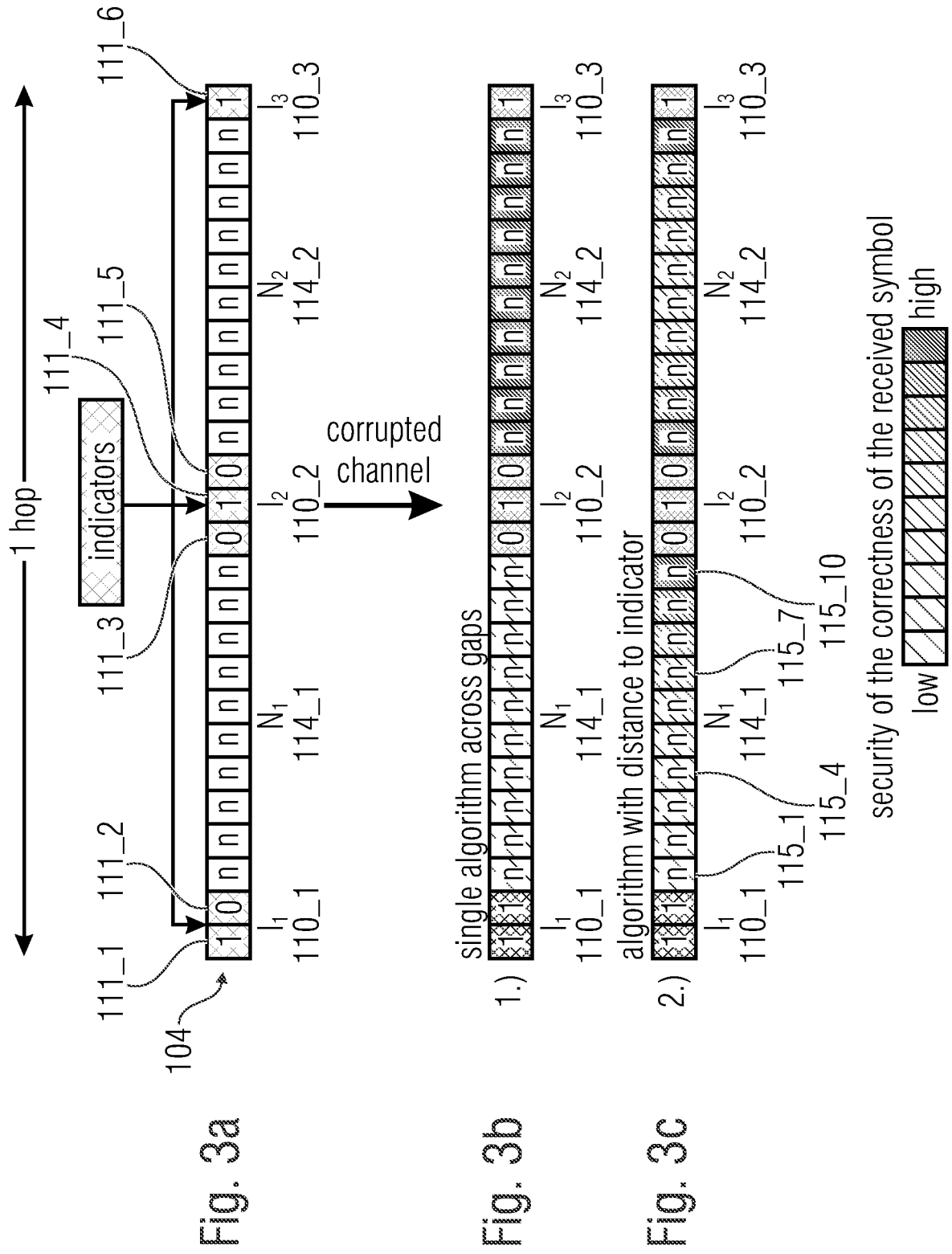
FIG. 3a is a schematic view of a data packet transmitted by a data transmitter according to an embodiment of the present invention.
FIG. 3b is a schematic view of a version of the data packet received by the data receiver when the data packet shown in FIG. 3a is transmitted by the data transmitter via a corrupted communication channel according to an embodiment of the present invention.
FIG. 3c is a schematic view of a version of the data packet received by the data receiver when the data packet shown in FIG. 3a is transmitted by the data transmitter via a corrupted communication channel according to an embodiment of the present invention.

FIG. 3a shows a schematic view of a data packet 104 transmitted by a data transmitter. As can be seen in FIG. 3a, the data packet 104 can comprise several indicators 110 that are arranged in a distributed manner in the data packet 104 according to their temporal occurrence. Here, an indicator 110 can include at least one indicator symbol 111, wherein one indicator symbol 111 is one symbol of a modulation method used for transmitting the at least one data packet 104 or corresponds to the same.

As already mentioned, the indicators 110 are not used for synchronization or frequency estimation by the means 102 for receiving data packets, but by the means 106 for further processing received data 112 for determining the degree of interference of the channel-coded payload data included in the data packet 104, which is subsequently considered in channel decoding. Thus, it is sufficient when 30% or less of the symbols of the modulation method used for transmitting the data packet 104 are indicator symbols. Further, it is sufficient when, in the data packet 104, at the most four indicator symbols are arranged in an immediately successive manner according to their temporal occurrence.

The data packet 104 shown in FIG. 3a comprises exemplarily three indicators 110_1 to 110_3, wherein the indicators 110_1 to 110_3 are arranged in the data packet 104 in a distributed manner. A first block of payload data 114_1 is arranged between the first indicator 110_1 and the second indicator 110_2, while a second block of payload data 114_2 is arranged between the second indicator 110_2 and the third indicator 110_3. Further, a first indicator 110_1 of the three indicators 110_1 to 110_3 comprises two indicators symbols 111_1 and 111_2, wherein a second indicator 110_2 of the three indicators 110_1 to 110_3 comprises three indicator symbols 111_3 to 111_5, and wherein a third indicator 110_3 of the three indicators 110_1 to 110_3 comprises an indicator symbol 111_6.

In other words, FIG. 3a shows how a data packet (hop) 104 can be structured with indicators 110 when binary modulation is used. It should be noted that the indicators 110_1 to 110_3 are not necessarily located at the beginning and end of the data packet (hop) 104. The optimal position, length and number of the indicators are the subject-matter of optimizing with respect to the external parameters given by the system.

FIG. 3b shows a schematic view of a version of the data packet 104 received by the data receiver 100 when the data packet 104 shown in FIG. 3a is transmitted by the data transmitter via a corrupted communication channel. As can be seen in FIG. 3b, the second indicator symbol 111_2 of the first indicator 110_1 has been corrupted.

The means 106 for further processing received data 112 is configured to compare the received indicators 110_1 to 110_3 with reference indicators and to determine, based on the comparison, a degree of interference of the received channel-coded payload data and to weight the received channel-coded payload data based on the determined degree of interference for decoding.

In the case shown in FIGS. 3a and 3b, the comparison between the indicators 110_1 to 110_3 would accordingly result in the fact that the second indicator symbol 111_2 of the first indicator 110_1 is corrupted, while the other indicator symbols are not corrupted.

According to an embodiment, the means 106 for further processing received data 112 can determine, based on the comparison of, for example, one (unitary) degree of interference for the payload data that are (each) arranged between the indicators wherein the degree of interference can assume, for example, two different values, for example corrupted and not corrupted. In the subsequent channel decoding, the payload data that are not corrupted can be weighted stronger than the corrupted payload data. For example, in channel decoding, only the payload data that are not corrupted can be considered while the payload data that are corrupted are deleted. Obviously, other weighting factors can be used. For example, the payload data that are not corrupted can be incorporated in the channel decoding with a factor less than one (e.g. 0.8), while the payload data that are corrupted can be incorporated in the channel decoding with a factor greater zero (e.g. 0.2), wherein a factor of one corresponds to a complete consideration of the respective payload data and wherein a factor of zero corresponds to discarding the respective payload data.

In the case shown in FIGS. 3a and 3b, the means 106 for further processing received data 112 can determine, for example, that the first block of payload data 114_1 between the first indicator 110_1 and the second indicator 110_2 is corrupted, while the second block of payload data 114_2 between the second indicator 110_2 and the third indicator 110_3 is not corrupted, such that, for example, only the second block of payload data 114_2 is considered in channel decoding while the first block of payload data 114_1 is discarded.

After receiving a data packet (hop) 104, the received payload data symbols can hence be evaluated based on the errors in the received indicators 110_1 to 110_3 and the security of the correct reception of each symbol can be defined before the data are transferred to channel decoding. Thus, the indicators 110 are not part of channel coding. Weighting the security can be designed arbitrarily in a simple or complex manner.

As a simple example for such a method, the differentiation between "not corrupted—with given security" and "corrupted—insecure" can be used. Here, the symbols are sorted into the respective category based on the adjacent indicators (cf. FIG. 3b).

If this method is also used to detect the shortest expected interferer, the period between two indicators may not be longer than this interferer, since it can otherwise happen that the indicators 110_1 to 110_3 are transmitted without being corrupted, but the information symbols 114_1 and 114_2 between the indicators 110_1 to 110_3 have been corrupted. Thereby, weighting of the symbols would adversely influence the performance of the error protection code.

FIG. 3c shows a schematic view of a version of the data packet 114 received by the data receiver 100 when the data packet shown in FIG. 3a is transmitted by the data transmitter via a corrupted communication channel. As in FIG. 3b, the second indicator symbol 111_2 of the first indicator 110_1 has also been corrupted.

In this embodiment, the means 106 for further processing received data 112 can be configured to determine a degree of interference of part of the payload data having, in the data packet 104, a lower (temporal) distance to one of the at least two spaced-apart indicators, stronger in dependence on the comparison of the one indicator with the respective reference indicator than part of the payload data that has a greater (temporal) distance to the one indicator in the at least one data packet.

In the case shown in FIGS. 3a and 3c, the comparison between indicators 110_1 to 110_3 would respectively result in the fact that the second indicator symbol 111_2 of the first indicator 110_1 is corrupted while the other indicator symbols are not corrupted.

Accordingly, the means 106 for further processing received data 112 would determine, for the payload data symbols (e.g. the payload data symbol 115_1) that have a temporally lower distance to the corrupted first indicator 110_1, a higher degree of interference than for payload data symbols (e.g. payload data symbol 115_4 or 115_7 or 114_10) that have a temporally higher distance to the corrupted first indicator 110_1 and a temporally lower distance to the second indicator 110_2 that is not corrupted. The different degrees of interference of the payload data symbol from low (e.g. for the payload data symbol 115_10) to high (e.g. for the payload data symbol 115_1) are illustrated in FIG. 3c by the different colors/shadings.

As can be seen in FIG. 3c, the means 106 for further processing of received data 112 can be configured to determine several (at least three) different degrees of interference based on the indicators. Further, the means 106 for further processing received data can be configured to determine several (at least three) different weighting stages or weighting factors based on the several different degrees of interference.

In other words, more complex methods can analyze the error patterns in the indicators and can individually adapt the security of the individual payload symbols based thereon. If an indicator is corrupted and the subsequent one not, the security of a payload symbol could be determined, e.g. based on its temporal proximity to the corrupted indicator (cf. FIG. 3). With this method, it is not necessitated to place the indicators so close to one another that the shortest interferer is detected, since the symbols that are possibly corrupted have already been assigned a lower security. The optimum length and distribution of indicators is an optimization problem which is specifically adapted to the given scenario.

If the receiver determines, e.g. by analyzing the check sums, that a high error rate occurs despite the optimization, he can adaptively adapt the function for weighting the symbols. This allows the receive node to adapt the transmission to its actual environment.

If the receive chip has the option of determining the received signal power of a hop (e.g. via RSSI measurement (RSSI=received signal strength indication)), the same can be recorded and the course of the powers across one or several messages can be stored. In hops where the receive power deviates significantly from previous measurements, it is likely that an interferer has been active or that the signal has been attenuated and the security of correctness of the received symbols of this hop can be corrected accordingly.

Thus, FIGS. 3a to 3c show data packets with three indicators of different lengths, payload symbols n in two payload data blocks 114_1 ($N_1$) and 114_2 ($N_2$) prior to (FIG. 3a) and after (FIGS. 3b and 3c) transmission via the corrupted channel. In FIG. 3b, 114_1 ($N_1$) is marked as being corrupted, since indicator 110_1 ($I_1$) is corrupted, while 114_2 ($N_2$) is marked as being not corrupted since 110_2 ($I_2$) and 110_3 ($I_3$) are not corrupted. In FIG. 3c, the start of 114_1 ($N_1$) has a lower security since the start is closer to the corrupted indicator 110_1 ($I_3$). The end of 114_1 ($N_1$) has, however, a higher security since the end is closer to the corrupted indicator 110_2 ($I_2$). The center of 114_2 ($N_2$) has a lower security due to the greater distance to the indicators 110_2 ($I_2$) and 110_2 ($I_3$) that are not corrupted.

Figure 4:
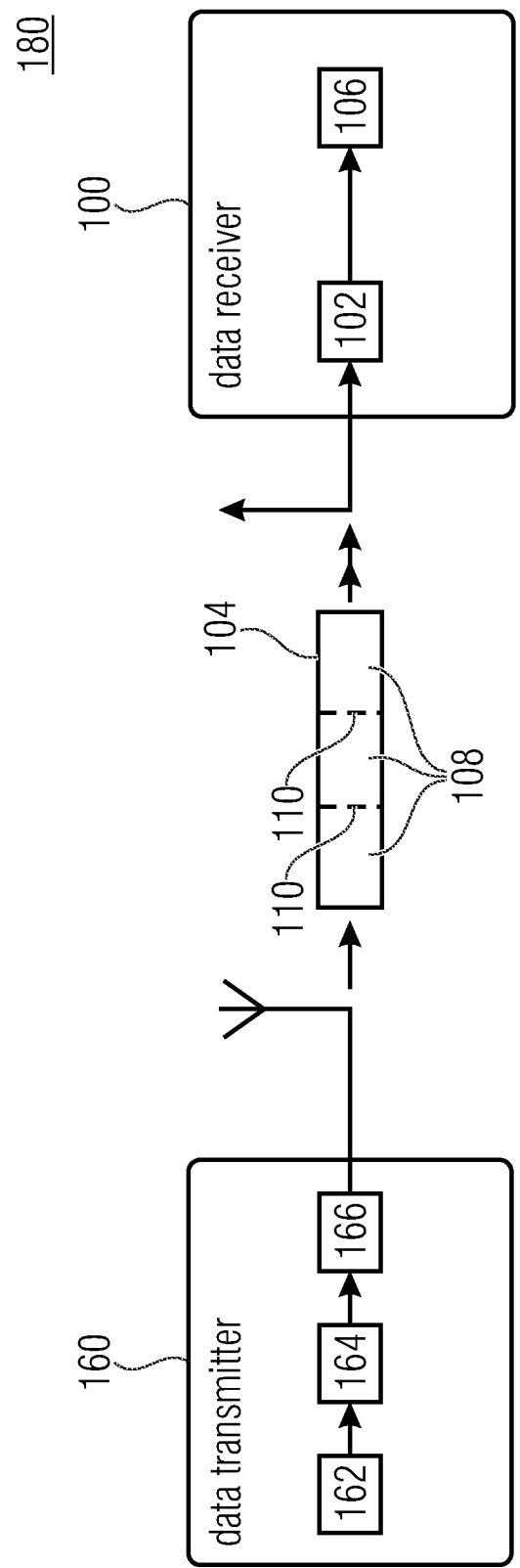
FIG. 4 is a schematic block diagram of a system with a data transmitter and a data receiver according to an embodiment of the present invention.

FIG. 4 shows a schematic block diagram of a system 180 with a data transmitter 160 and the above-described data receiver 100 according to an embodiment of the present invention.

The data transmitter 160 can be configured to transmit the data packet 104 with the channel-coded payload data 108 and the at least one indicator 110 to the data receiver 100 via the communication channel.

In detail, the data transmitter 160 can comprise means 162 for channel coding payload data that is configured to channel-code the payload data to obtain the channel-coded payload data. Further, the data transmitter 100 can comprise means 164 for generating data packets that is configured to generate at least one data packet (e.g. at least two data packets in the packet division method) from the channel-coded payload data. The means 164 for generating data packets can be configured to provide the channel-coded payload data (in the data packet) with at least one indicator that is known to the data transmitter 160 and the data receiver 100. Further, the data transmitter 160 can comprise means 166 for transmitting data packets that is configured to transmit the at least one data packet 104 via the communication channel to the data receiver 100.

In embodiments, the data transmitter 160 can, for example, be a base station, while the data receiver 100 is a node. Obviously, the data transmitter 160 can also be the node while the data receiver 100 is the base station.

In the following, embodiments for minimizing energy consumption will be described.

In order to minimize the current consumption, apart from increasing the robustness of the connection, transmission at a determined time at a determined frequency can be used. Thereby, it is possible for the receiver 100 to operate the receive chip 102 as briefly as possible in the active receive mode and to also deactivate all other components as long as waking up at a fixed time is ensured (low power mode) with active timer or activated real-time clock, see FIG. 5.

Figure 5:
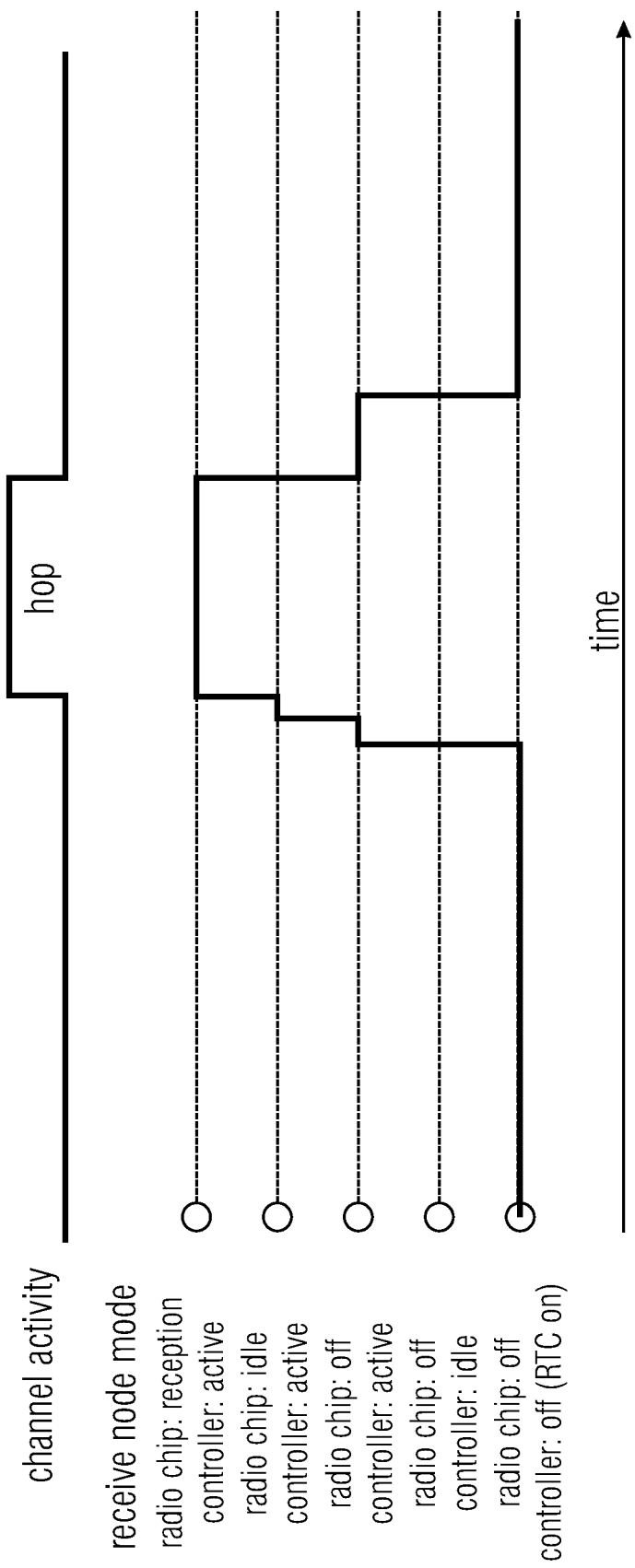
FIG. 5 is, in one diagram, channel activity when transmitting a data packet and in one diagram, energy consumption of the receiver when receiving the data packet, each plotted over time.

In detail, FIG. 5 shows in a diagram channel activity when transmitting a data packet (hop) 104 and in a diagram energy consumption of the receiver 100 when receiving the data packet 104, each plotted over time.

As can be seen in FIG. 5, the data receiver 100 is in a first operating mode (or operating state) at a first time (prior to receiving the data packet) where both the radio chip 102 and the controller 106 are deactivated (switched off). At a second time, the data receiver 100 is in a second operating mode where the controller 106 is in idle mode, while the radio chip 102 is deactivated. At a third time (which can coincide with the second time), the data receiver 100 is in a third operating mode where the controller 106 is activated while the radio chip 102 is deactivated. At a fourth time, the data receiver 100 is in a fourth operating mode where the controller 106 is active while the radio chip 102 is idle. At a fifth time (at the time of receiving the data packet), the data receiver 100 is in a fifth operating mode, where the controller 106 is active and the radio chip 102 receives the data packet 104.

At a sixth time (after receiving the data packet 104), the data receiver 100 is in the fourth operating mode. At a seventh time (which can coincidence with the sixth time, i.e. the fourth operating mode is skipped), the data receiver 100 is in the third operating mode. At an eighth time, the data receiver is in the second operating mode. At a ninth time (which can coincide with the eighth time, i.e. the second operating mode is skipped), the data receiver is in the first operating mode.

In other words, FIG. 5 shows an exemplary course of the possible modes of the receive node 100 when receiving a data packet (hop) 104. The real-time clock can wake up the controller 106 at the exact time for switching the radio chip 102 to reception at a predefined time. Activation of the controller 106 after reception for processing the received symbols.

In order for the receiver 100 to be able to hit the exact time of a message without synchronization, the symbol rate of the transmission method can be selected so low that the run time of the signal remains neglectable compared to the transmission duration of an individual symbol. This results in the context that the possible range of the system can be influenced via the symbol rate. For determining the exact arrival time of a message, there are different possibilities. Exemplarily, some methods are listed herein, but other methods for obtaining this are also possible. A first method is the absolute time: receiving a message every day at a predetermined time. Necessitates exact and synchronous clocks in transmitter and receiver. A second method is an external event: an influence (light impulse, noise, radio waves, etc.) at a time t which is perceived equally by the transmitter and the receiver and triggers the reception of a message at a time $t+\Delta t$, $\Delta t \geq 0$ at the node. A third method is an explicit request: the node has the option of transmitting messages itself and notifies the base station explicitly when it is waiting for a message. A fourth method is an implicit request: the node itself transmits data regularly. After a predetermined number of transmitted messages, the node expects a message from the base station. The time difference between transmitting the own message and receiving the message of a base is determined in advance.

If the time cannot be predicted exactly, the same can be determined more accurately with the help of the indicators. However, no specific preamble for detection has to be inserted. The receiver does not have to continuously search for a telegram to be received.

If there is not enough computing power in the receiver 100 for real-time decoding of the telegram, the receive values or partly demodulated receive values can be cached.

Reducing the overhead by additional preamble symbols and the resulting shorter necessitated channel usage period for response of an individual node allows additionally the increase of the number of addressed nodes with same overall usage period of the channel or to reduce the interference of other systems in the same frequency band with constant node number.

In embodiments, the payload data can be transmitted via the communication channel by the data transmitter divided into at least two data packets. Here, the means 106 for further processing received data 112 can be configured to combine the received channel-coded payload data of the at least two data packets in order to obtain a higher code gain for channel decoding by combining the received channel-coded payload data.

Due to the used telegram-splitting method, it is also possible to operate the receiver node 100 by means of energy harvesting or batteries that can supply the receiver 100 with current not directly but via temporary energy storage (capacitor). This is possible since a message is not received as a whole but in individual parts (divided across several (at least two) data packets). This allows the receiver 100 to recharge its energy supply between the data packets (hops) 104 and to enable further reception. For accommodating the specific requirements of the data receivers (nodes) 100 and their energy supply, it is possible to optimize the time sequence of the data packets (hops) 104 such that the reception of an entire message can be ensured with a specific probability. Further, the receiver 100 can decide based on its available energy whether it receives a data packet (hop) 104 or not. If it has already selected a large amount of data packets, it could be more favorable as regards to energy to omit the data packet 104 in order to collect energy again first.

For additionally shortening the transmission period, all symbols for detection and frequency estimation can be omitted. This is possible when the transmitter 160 has correspondingly powerful hardware for exactly hitting the transmission time and the transmission frequency of the receiver 100.

By using specifically favorable components in the data receiver (node) 100, the exact adjustment of a receive frequency is not possible in each case (inaccuracies and aging of the quartzes). For the fact that the real receive frequency of the data receiver (node) deviates too strongly from the adjusted frequency, the transmitter 160 can determine the real receive frequency in order to transmit at the same.

For this, the data receiver (receive node) 100 can have already transmitted a message at a previously defined frequency to the base station, prior to receiving the message. Then, the packet 104 is returned at this frequency (cf. DE 10 2011 082 100 A1).

A further measure for reducing the energy consumption results by prematurely terminating the reception of a message when the data receiver (node) 100 determines that no message has been transmitted, a message is not intended for him or has already fallen below a predetermined minimum overall security prior to receiving the last data packet (hop) 100. In the latter case, the received data packets (hops) 100 have already been corrupted so strongly that successful decoding is classified as unlikely, thus, reception of the residual data packets (hops) 100 and decoding can be suspended for saving energy and the receiver can be placed in a mode with very low energy consumption.

An extension of this method allows further savings in current consumption by respective distribution of the channel-coded payload data symbols. Thus, the same are distributed within the message such that already after receiving part of the entire message, with respective security of the payload data symbols, a decoding process can be started. If the same is successful, it will no longer be necessitated to receive the rest of the payload data and the data receiver (node) 100 has to remain in the active receive mode with high current consumption for a shorter time period as will be discussed below with reference to FIG. 6.

Figure 6:
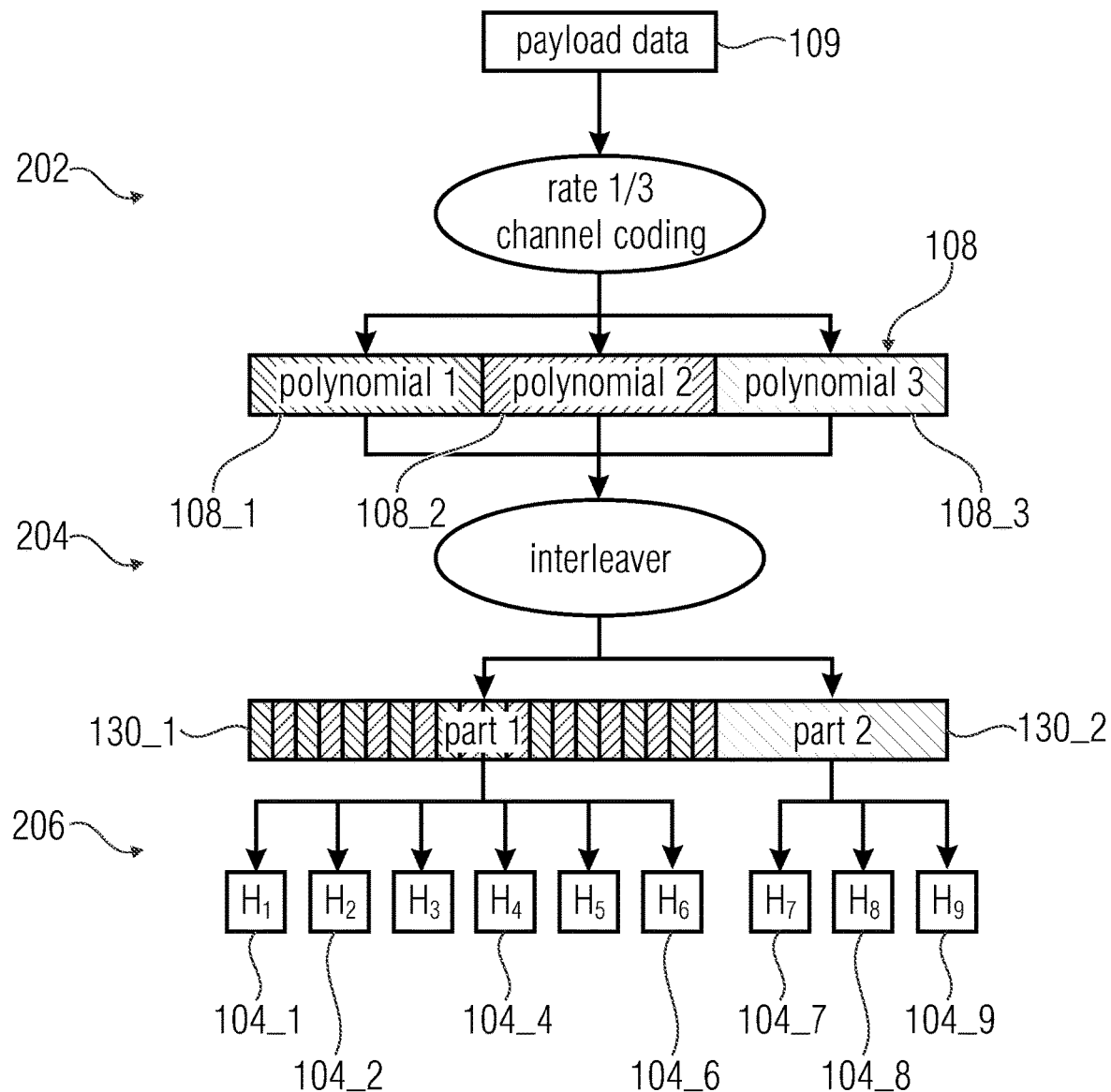
FIG. 6 is a schematic flow diagram of a method for generating data packets according to an embodiment of the present invention.

FIG. 6 shows a schematic flow diagram of a method 200 for generating data packets 104 according to an embodiment of the present invention. In other words, FIG. 6 shows an exemplary division of the channel-coded symbols for allowing decoding after successful reception of part of the message.

In a first step 202, the payload data 109 can be channel-coded (e.g. with a code rate of ⅓) for obtaining channel-coded payload data 108. The channel-coded payload data 108 can include, for example, at least three polynomials 108_1 to 108_3 of channel-coded payload data.

In a second step 204, the channel-coded payload data 108 can be at least partly interleaved, in order to obtain at least two parts 130_1 and 130_2 of differently interleaved channel-coded payload data. For example, the at least three polynomials 108_1 to 108_3 of channel-coded payload data can be supplied to an interleaver (means for interleaving) for obtaining the at least two parts 130_1 and 130_2 of differently interleaved channel-coded payload data. As can be seen in FIG. 6, the first polynomial 108_1 and the second polynomial 108_2 of channel-coded payload data can be (completely) interleaved with one another in order to obtain the first part 130_1 of differently interleaved channel-coded payload data while the third polynomial 108_3 is not interleaved in order to obtain the second part 130_2 of differently interleaved channel-coded payload data.

In a third step 106, the at least two parts 130_1 and 130_2 of differently interleaved channel-coded payload data can be divided into a plurality of data packets 104_1 to 104_9. For example, the first part 130_1 of interleaved channel-coded payload data can be divided into six data packets 104_1 ($H_1$) to 104_6 ($H_6$), while the second part 130_2 of (interleaved) channel-coded payload data is divided in three data packets 104_7 ($H_7$) to 104_9 ($H_9$).

The above-described method can be performed, for example, by the data transmitter 160 (or the means 164 for generating data packets of the data transmitter 160).

FIG. 6 shows as an example that it can be sufficient to collect the data of all data packets (hops) 104_1 ($H_1$) to 104_6 ($H_6$) of the first part 130_1 and to start the first decoding attempt. If the quality of the data packets (hops) 104_1 ($H_1$) to 104_6 ($H_6$) has been sufficient and the decoding successful, receiving the missing data packets (hops) 104_7 ($H_7$) to 104_9 ($H_9$) will not be necessitated.

In the following, improvements and advantages generated by embodiments of the present invention will be described.

By telegram-splitting, receivers 100 that are operated via temporary energy storage can receive, all in all, longer telegrams, thereby a higher transmission range with the given information amount and a higher information amount with a given transmission range, respectively, can be obtained.

Despite limitations of simple receive chips during interferences of the transmission by other radio participants, the data receiver 100 allows robust data transmission from a base station to simple receive nodes.

By reducing the receive period and the simplicity of evaluating the symbol security, the current consumption can be reduced further. If no telegram has been transmitted, by early termination of the reception. If a telegram has been transmitted, by early termination when the telegram can already be received correctly with a data subset.

Although some embodiments have been described where the data carrier 100 is a node and the data transmitter base station, it should be noted that the present invention is not based on such embodiments. Rather, the data transmitter 100 can also be a base station and the data receiver a node.

Figure 7:
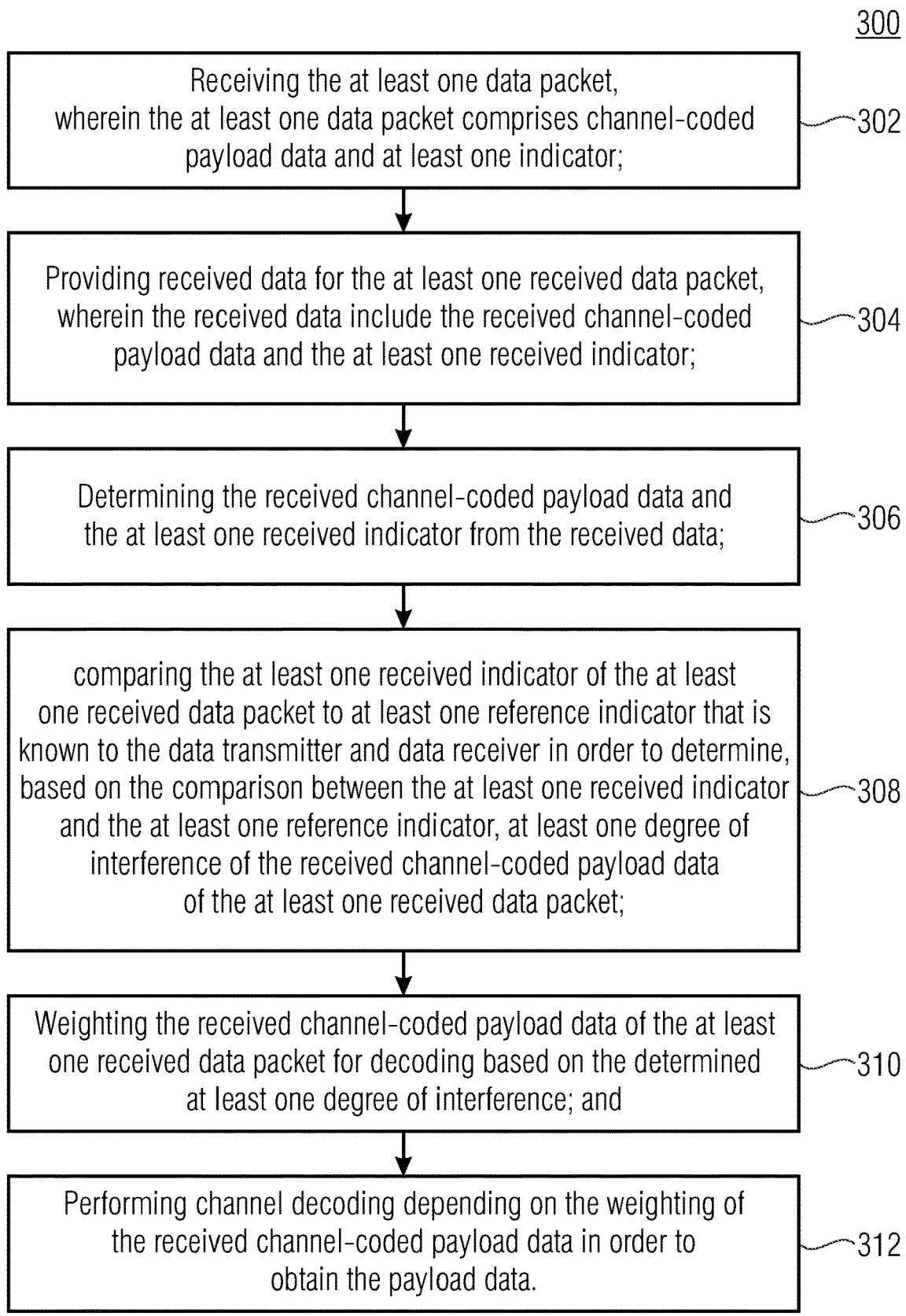
FIG. 7 is a flow diagram of a method for receiving payload data that are transmitted by a data transmitter by means of at least one data packet via a communication channel according to an embodiment of the present invention.

FIG. 7 shows a flow diagram 300 of a method for receiving payload data that are transmitted via a communication channel by a data transmitter by means of at least one data packet. The method 300 includes a step 302 of receiving the at least one data packet, wherein the at least one data packet comprises channel-coded payload data and at least one indicator; a step 304 of providing received data for the at least one received data packet, wherein the received data include the received channel-coded payload data and the at least one received indicator; a step 306 of determining the received channel-coded payload data and the at least one received indicator from the received data; a step 308 of comparing the at least one received indicator of the at least one received data packet to at least one reference indicator that is known to the data transmitter and data receiver in order to determine, based on the comparison between the at least one received indicator and the at least one reference indicator, at least one degree of interference of the received channel-coded payload data of the at least one received data packet; a step 310 of weighting the received channel-coded payload data of the at least one received data packet for decoding based on the determined at least one degree of interference; and a step 312 of performing channel decoding depending on the weighting of the received channel-coded payload data in order to obtain the payload data.

In the following, further embodiments of the present invention will be described.

In receivers that are provided with respectively inexpensive and effective chips, the estimation of the quality of the receive symbols of the individual data packets (hops) cannot be read directly from the output data of the radio chip. However, for the performance of many systems, this quality assessment is an essential component. Thus, the performance of many error correction mechanisms (e.g. convolution decoder) is significantly better when information on the quality of the received symbols exists or when the symbol is assumed as being completely unknown when a quality threshold has not been reached.

Regarding the energy consumption, apart from quality estimation, the time when the receiver is in an active receive mode also is to be minimized.

For fulfilling these two criteria even with simple cost-effective hardware, a transmission method with short packets based on the packet division method (telegram-splitting, see DE 10 2011 082 098 B4) can be used, which can additionally use a low data rate for increasing the range. By omitting any synchronization and preamble symbols, the active receive time of the receiver can be shortened. For improving the performance, few additional symbols (indicators) are inserted in order to enable quality estimation for the symbols of an individual data packet (hop) or a partial data packet (partial hop).

This system is especially interesting for distributing little information to many nodes, since the short packet length keeps the limited channel usage period for an individual node short, without much overhead, and also minimizes the energy consumption at the individual receive node. Additionally, by the enabled quality judgement, even transmission to cost-effective radio chips obtains the necessitated robustness for being used in frequency bands together with other systems that cause interferences.

Possibly, the node can also use the inserted and known additional symbols as synchronization information and hence enables better reception (e.g. by coherent demodulation or estimation of the frequency offset).

In the following, further embodiments of the present invention will be described.

In embodiments, the base station can transmit a channel-coded message to the node by the telegram-splitting method. Here, few indicators can be distributed in a data packet (hop). The distribution and length of the indicators can be adapted to the expected interference scenario and the requirements for quality estimation. Optionally, further (additional) indicators can be inserted in order to enable detection and frequency estimation. Optionally, the transmitting frequency can also be adapted to compensate possible deviations from the planned frequency in the receiver (e.g. by inaccuracies of the quartzes).

In embodiments, the receiver knows the exact time when the data packet 104 or an indicator arrives, such that the receiver can switch on the receive chip at this time. The receive time can be determined, for example, based on the absolute time (GPS), an external event or by a known time difference to an event.

In embodiments, after receiving a data packet (hop), it can be decided based on the indicator symbols whether the data packet (hop) or parts of the data packet (hop) have been corrupted. If all indicators correspond to the previously determined indicator pattern and have been received correctly according to a metric, the information of the entire data packet (hop) can be declared as being not corrupted. If the indicators do partly not correspond to the expected symbol, the information part between the corrupted indicator and the next indicator can be declared as being corrupted.

In embodiments, the information of the data packet can be used when the data packet (hop) is not corrupted. If, however, the data packet is corrupted, its information can either be discarded or used further with lower weighting. If too many corrupted data packets (hops) or partial data packets (partial hops) occur during the reception of a message, such that the probability of an error-free reception already falls below a threshold, the reception of further data packets (hops) can be terminated in order to save energy.

In embodiments, the at least one indicator operates on already decided symbols, i.e. where the synchronization and the channel estimation have either taken place already or are not necessitated. The usage of indicators is primarily intended for the case that a simple receiver is used that cannot provide any quality information on the decided symbols.

In embodiments, the data receiver can comprise a receiver IC (radio chip) which has already taken on the synchronization for the user and the synchronization and preamble symbols are not available for the user since only the payload data are output.

In embodiments, the indicators can be used on common radio receiver ICs (radio chips), which offer the user no option for influencing the frequency or channel estimation. Then, from the errors in the indicators, the correct weighting function for adjacent symbols can be found, which then improves the decoding of the channel-coded data.

In embodiments, the data receiver can have a standard radio chip providing already decided bits at the output. Here, the performance of the channel decoding is worse than in soft decision receivers (decoders considering forward-error correction and not providing any hard decided bits). With interferer detection via the indicators, the performance of channel decoding can be improved.

Further embodiments relate to a system for transmitting data from a base station, e.g. control data for adapting individual parameters of an actuator or sensor to an individual or large number of simple nodes. Due to cost and energy consumption considerations, the computing power as well as options of radio analysis are only possible to a limited extent at the receiver. In contrary, powerful hardware is available at the base station which allows exact adjustment of the transmission frequency and the transmission time.

Further embodiments relate to the wireless transmission method which can also be transferred to other fields of application.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus. Some or all of the method steps may be performed by a hardware apparatus (or using a hardware apparatus), such as a microprocessor, a programmable computer or an electronic circuit. In some embodiments, some or several of the most important method steps may be performed by such an apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable.

Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer.

The program code may, for example, be stored on a machine readable carrier.

Other embodiments comprise the computer program for performing one of the methods described herein, wherein the computer program is stored on a machine readable carrier.

In other words, an embodiment of the inventive method is, therefore, a computer program comprising a program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment in accordance with the invention includes an apparatus or a system configured to transmit a computer program for performing at least one of the methods described herein to a receiver. The transmission may be electronic or optical, for example. The receiver may be a computer, a mobile device, a memory device or a similar device, for example. The apparatus or the system may include a file server for transmitting the computer program to the receiver, for example.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods are performed by any hardware apparatus. This can be a universally applicable hardware, such as a computer processor (CPU) or hardware specific for the method, such as ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Data receiver for receiving payload data transmitted by a data transmitter by means of at least one data packet via a communication channel, comprising:

receiver for receiving data packets that is configured to receive the at least one data packet, wherein the at least one data packet comprises channel-coded payload data and at least one indicator, wherein the receiver for receiving data packets is configured to output, for the at least one received data packet, received data that comprise the received channel-coded payload data and the at least one received indicator;

processor for further processing received data that is configured to determine, from the received data, the received channel-coded payload data and the at least one received indicator and to compare the at least one received indicator of the at least one received data packet to at least one reference indicator that is known to the data transmitter and data receiver and to determine, based on the comparison between the at least one received indicator and the at least one reference indicator, at least one degree of interference of the received channel-coded payload data of the at least one received data packet;

wherein the processor for further processing received data is configured to weight the received channel-coded payload data of the at least one received data packet based on the determined at least one degree of interference for decoding and to perform channel decoding depending on the weighting of the received channel-coded payload data for acquiring the payload data;

wherein the at least one data packet comprises at least two indicators that are arranged spaced apart from one another in the data packet;

wherein the processor for further processing received data is configured to determine a degree of interference of part of the channel-coded payload data that has a lower distance to one of the at least two spaced-apart indicators in the data packet more strongly in dependence on the comparison of the one indicator with the respective reference indicator than part of the payload data that has a greater distance to the indicator in the at least one data packet.

2. Data receiver according to claim 1, wherein the receiver for receiving data packets is configured to output the received data in the form of already decided bits.

3. Data receiver according to claim 1, wherein the receiver for receiving data packets is configured to output no information on a quality of the received data.

4. Data receiver according to claim 1, wherein the receiver for receiving data packets is configured to use the at least one indicator not for receiving the at least one data packet.

5. Data receiver according to claim 1, wherein the data packet comprises a control data region and a payload data region, wherein the payload data region comprises the channel-coded payload data and the at least one indicator as data;

wherein the receiver for receiving data packets is configured to output the data comprised in the payload data region as received data.

6. Data receiver according to claim 5, wherein the control data region comprises a synchronization sequence, wherein the receiver for receiving data packets is configured to perform synchronization of the data packet by using the synchronization sequence.

7. Data receiver according to claim 5, wherein the receiver for receiving data packets is configured to not output the data comprised in the control data region.

8. Data receiver according to claim 1, wherein the at least one indicator comprises at least one indicator symbol, wherein an indicator symbol is a symbol of a modulation method used for transmitting the at least one data packet or corresponds to the same.

9. Data receiver according to claim 8, wherein at most 30% of the symbols of the modulation method used for transmitting the data packet are indicator symbols, such that the data receiver cannot perform complete synchronization or frequency estimation based on the indicator symbols.

10. Data receiver according to claim 8, wherein, in the at least one data packet, at most four indicator symbols are arranged in an immediately successive manner, such that the data receiver cannot perform complete synchronization or frequency estimation based on the indicator symbols.

11. Data receiver according to claim 1, wherein the at least one data packet comprises several indicators that are arranged in the data packet in a distributed manner.

12. Data receiver according to claim 1, wherein the processor for further processing received data knows an arrangement according to which the at least one indicator is arranged in the data packet;

wherein the processor for further processing received data is configured to determine the at least one indicator from the received data by using the known arrangement.

13. Data receiver according to claim 1, wherein the data receiver knows the time of arrival of the at least one indicator and/or the at least one data packet.

14. Data receiver according to claim 13, wherein the data receiver or a timer of the data receiver is configured to activate the receiver for receiving data packets for the reception of the data packet and to deactivate the same again after reception of the data packet for saving energy.

15. Data receiver according to claim 1, wherein the payload data, divided into at least two data packets, are transmitted by the data transmitter via the communication channel;

wherein the processor for further processing received data is configured to combine the received channel-coded payload data of the at least two data packets in order to acquire a higher code gain for channel decoding by the combination of the received channel-coded payload data.

16. Data receiver according to claim 15, wherein the data receiver is configured to deactivate the receiver for receiving data packets when sufficient data packets have been received for channel decoding in order to save energy.

17. Data receiver according to claim 15, wherein the data receiver is configured to prematurely terminate reception of payload data that have been transmitted by the data transmitter divided into at least two data packets, when the data receiver determines that:

no payload data have been transmitted;
the payload data are not intended for the data receiver but for a different data receiver; or
a minimum overall security necessitated for channel decoding has not been reached.

18. System, comprising:
a data receiver according to claim 1; and
a data transmitter that is configured to transmit the at least one data packet with the channel-coded payload data and the at least one indicator to the data receiver via the communication channel.

19. System according to claim 18, the data transmitter comprising:
channel-coder for channel-coding payload data that is configured to channel-code the payload data to acquire the channel-coded payload data;
generator for generating data packets that is configured to generate the at least one data packet from the channel-coded payload data, wherein the generator for generating data packets is configured to provide the channel-coded payload data with the at least one indicator that is known to the data transmitter and the data receiver; and
transmitter for transmitting data packets that is configured to transmit the at least one data packet via the communication channel to the data receiver.

20. Data transmitter according to claim 18, wherein the generator for generating data packets is configured to interleave at least two different parts of the channel-coded payload data at least partly in order to acquire at least two parts of differently interleaved channel-coded payload data;

wherein the generator for generating data packets is configured to divide the at least two parts of differently interleaved channel-coded payload data into a plurality of data packets; and wherein the transmitter for transmitting data packets is configured to transmit the plurality of data packets.

21. Method for receiving payload data that are transmitted by a data transmitter by means of at least one data packet via a communication channel, the method comprising:

receiving the at least one data packet, wherein the at least one data packet comprises channel-coded payload data and the at least one indicator;

providing received data for the at least one received data packet, wherein the received data comprise the received channel-coded payload data and the at least one received indicator;

determining the received channel-coded payload data and the at least one received indicator from the received data;

comparing the at least one received indicator of the at least one received data packet to at least one reference indicator that is known to the data transmitter and data receiver to determine, based on the comparison between the at least one received indicator and the at least one reference indicator, at least one degree of interference of the received channel-coded payload data of the at least one received data packet;

weighting the received channel-coded payload data of the at least one received data packet for decoding based on the determined at least one degree of interference; and performing channel decoding depending on the weighting of the received channel-coded payload data for acquiring the payload data:

wherein the at least one data packet comprises at least two indicators that are arranged spaced apart from one another in the data packet;

determining a degree of interference of part of the channel-coded payload data that has a lower distance to one of the at least two spaced-apart indicators in the data packet more strongly in dependence on the comparison of the one indicator with the respective reference indicator than part of the payload data that has a greater distance to the indicator in the at least one data packet.

22. A non-transitory digital storage medium having a computer program stored thereon to perform the method for receiving payload data that are transmitted by a data transmitter by means of at least one data packet via a communication channel, the method comprising:

receiving the at least one data packet, wherein the at least one data packet comprises channel-coded payload data and the at least one indicator;

providing received data for the at least one received data packet, wherein the received data comprise the received channel-coded payload data and the at least one received indicator;

determining the received channel-coded payload data and the at least one received indicator from the received data;

comparing the at least one received indicator of the at least one received data packet to at least one reference indicator that is known to the data transmitter and data receiver to determine, based on the comparison between the at least one received indicator and the at least one reference indicator, at least one degree of interference of the received channel-coded payload data of the at least one received data packet;

weighting the received channel-coded payload data of the at least one received data packet for decoding based on the determined at least one degree of interference; and performing channel decoding depending on the weighting of the received channel-coded payload data for acquiring the payload data;

wherein the at least one data packet comprises at least two indicators that are arranged spaced apart from one another in the data packet;

determining a degree of interference of part of the channel-coded payload data that has a lower distance to one of the at least two spaced-apart indicators in the data packet more strongly in dependence on the comparison of the one indicator with the respective reference indicator than part of the payload data that has a greater distance to the indicator in the at least one data packet, when said computer program is run by a computer.

* * * * *